United States Patent [19]
Foerster et al.

[11] 3,949,415
[45] Apr. 6, 1976

[54] METHOD AND APPARATUS FOR COUPLING TO A STUDIO SYNCHRONIZER A RECORDED COLOR TV SIGNAL CONTAINING A FREQUENCY-TRANSLATED MODULATED CHROMINANCE SUBCARRIER

[75] Inventors: Hubert Foerster, Darmstadt; Andreas Ilmer, Braunschweig, both of Germany

[73] Assignee: Robert Bosch G.m.b.H., Stuttgart, Germany

[22] Filed: June 26, 1974

[21] Appl. No.: 483,438

[30] Foreign Application Priority Data
June 29, 1973 Germany............................ 2333148

[52] U.S. Cl. ....................................... 358/8; 360/36
[51] Int. Cl.² ....................... H04N 5/76; H04N 5/78
[58] Field of Search ................... 358/8, 4, 9, 17, 19; 360/36; 178/69.5 CB, 69.5 TV

[56] References Cited
UNITED STATES PATENTS

| | | | |
|---|---|---|---|
| 3,549,793 | 12/1970 | Ross...................................... | 358/19 |
| 3,629,491 | 12/1971 | Dann et al. ............................ | 360/36 |
| 3,637,936 | 1/1972 | Krause.......................... | 178/69.5 CB |
| 3,704,341 | 11/1972 | Fujita..................................... | 360/36 |

*Primary Examiner*—Robert L. Griffin
*Assistant Examiner*—R. John Godfrey
*Attorney, Agent, or Firm*—Michael J. Striker

[57] ABSTRACT

A color TV signal is recorded on an information carrier and includes a luminance component which occupies a predetermined luminance frequency range and a modulated chrominance subcarrier. In a conventional color TV signal, the modulated chrominance subcarrier occupies a first chrominance frequency range having a predetermined location relative to the luminance frequency range. However, the modulated chrominance subcarrier is assigned a different second frequency range which has the advantage that the modulated chrominance subcarrier in such range is easier to record. A color TV picture is to be reproduced from such recorded color TV signal. Firstly, there is introduced into such color TV signal a corrective phase shift bringing the signal into synchronism with a studio synchronizer. Only thereafter is the modulated chrominance subcarrier frequency-translated from the second back to the conventional first chrominance frequency range to thereby form a conventional color TV signal.

12 Claims, 3 Drawing Figures

METHOD AND APPARATUS FOR COUPLING TO A STUDIO SYNCHRONIZER A RECORDED COLOR TV SIGNAL CONTAINING A FREQUENCY-TRANSLATED MODULATED CHROMINANCE SUBCARRIER

BACKGROUND OF THE INVENTION

The invention relates to a method and apparatus for coupling the color television signal recorded on a magnetic tape to a studio synchronizer for the purpose of reproducing the color television picture represented by the signal. More particularly, the invention relates to a color television signal recorded on magnetic tape of the type wherein the chrominance signal is frequency-translated downwards into a frequency range lower than the frequency range of the luminance signal. Still more particularly, the invention relates to the problem of eliminating time base errors in the color television signal derived from the magnetic tape.

For the recording of TV signals onto magnetic tape for the purpose of subsequent reproduction, certain recording methods have come into common use. In particular, the high relative speeds between the magnetic head and the magnetic tape requisite for the recording of the high-frequency signal components are in general achieved by making use of magnetic heads mounted on the periphery of a magnetic head wheel turning at high speed and writing onto successive tracks oriented perpendicular to or inclined relative to the direction of travel of the magnetic tape.

A transverse-track recording method of this type making use of an approximately 50 mm magnetic tape is characterized by high resolution, a high signal-to-noise ratio, and good image stability. However, the equipment employed is complicated and expensive and, furthermore, by reason of the relatively great breadth of the magnetic tape, is very space-comsuming, as a result of which such system has hitherto found use only in TV studios.

To a growing degree, resort is had to a recording method making use of inclined tracks, according to which a significantly smaller magnetic tape is coiled around a longitudinally subdivided cylinder having a region of subdivision in which turns the magnetic head wheel provided with the magnetic heads. The magnetic tape, after the recording operation, comprises successive track sections which extend from one to the other longitudinal edge of the magnetic tape, at a very small angle to the direction of elongation of the tape, with each track section in general containing the signals representing one half image. In general, the tape, in addition to the portion thereof taken up by the tracks for the video signals, is furthermore comprised of a longitudinally extending audio signal track, as well as a control signal track onto which there are recorded, during the recording process, synchronizing signals for correctly synchronizing the operation of the magnetic head wheel and the magnetic tape drive during subsequent reproduction of the recorded TV picture.

As a result of the relatively small dimensions of the inclined-track magnetic tape apparatuses, new areas of application are opening up to the magnetic recording of TV signals. For example, portable battery-energized devices have been developed which in conjunction with a portable TV camera have made possible on-the-spot TV recording of events without regard to location. However, the subsequent reproduction of the recorded-on-the-spot TV signals by means of telecast equipment places demands upon the mechanical and electrical characteristics of the magnetic tape apparatuses almost as stringent as those which are customary for studio equipment. Even when, as a result of the smaller relative speed of movement between the magnetic heads and the magnetic tape, a lower resolution is to be tolerated, synchronization errors, which disadvantageously result in fluctuations of the horizontal image holding action, still must be suppressed or avoided.

The reproduction of color TV signals places even greater demands upon time stability, because with color TV signals even much smaller time errors will result in phase fluctuations in the TV signal leading to unacceptable color errors in the reproduced color TV picture.

The frequency of the conventional color subcarrier in the European PAL color television system is approximately 4.433 MHz. However, due to the limitation of bandwidth resulting from reduction in the speed of relative movement between the video heads and the magnetic tape in the magnetic tape apparatuses referred to above, signals in this frequency range cannot be satisfactorily recorded. It is known to frequency-translate downwards the chrominance signal into a frequency range below the lower sideband of the luminance signal. Known devices translate the chrominance subcarrier down to a frequency of 562.5 KHz with sidebands extending from 0 to about 1 MHz. Accordingly, the chrominance signal will occupy a frequency range lower than the frequency range of the FM luminance signal and, in this frequency range, can with very little interference be recorded onto magnetic tape using recording equipment of the type referred to above.

Additionally, in the event of phase fluctuations, the phase shift to which such signals are susceptible is reduced by an amount equal to the ratio of the frequency of the downwardly-translated chrominance subcarrier (i.e., 562.5 KHz) to the conventional chrominance subcarrier frequency in the European PAL system (i.e., 4.433 MHz).

Considered in absolute terms, the time base errors of TV signals derived from the magnetic head wheel of an inclined-track magnetic tape machine of simple design are about one order of magnitude higher than those of signals derived from the magnetic head wheel of a studio-type magnetic tape machine.

Accordingly, immediate coupling of the TV signal derived from an inclined-track magnetic tape machine with a studio synchronizer is not possible. Instead, the time base error of the signal derived from the magnetic tape must be brought down to a value of about 3 nanoseconds or less by means of an electronic phase equalizer, before the studio color carrier can be synchronized with the color carrier derived from the magnetic tape during reproduction of the recorded color TV picture.

A condition indispensable for achieving a standard or studio quality signal is that stringent coupling between the color carrier frequency and the horizontal frequency of the signal derived from the magnetic tape be guaranteed. However, in the known methods referred to above involving downwards frequency-translation of the chrominance signal and pilot carriers, this coupling is lost during the decoding of the TV signal in the reproducing equipment, and it is accordingly not possible to take the composite color television signal derived from such apparatus and subject the signal to a simple phase correction in order to synchronize the signal with the studio synchronizer, as would be done when only studio-quality equipment is involved.

SUMMARY OF THE INVENTION

It is a general object of the invention to provide a method and apparatus of the type discussed above which establishes the coupling between the studio color carrier frequency and the color carrier frequency of the signal derived from the magnetic tape requisite for studio reproduction of the color TV picture.

This object, and others which will become more understandable from the description below of specific embodiments, can be met, according to one advantageous concept of the invention, by correcting the time base error of the signal derived from the magnetic tape by introducing a time error correcting stage in the transmission path between the magnetic head which derives a signal from the recorded tape and the input of the decoder. In this way, it is possible to perform the time base error correction at a point in the sequence of signal processing operations where normal coupling still exists, namely prior to the transmission of the signal through the decoder arrangement. Then the decoder can be supplied with a properly timed signal, free of time base errors, so as to guarantee proper coupling between the incoming signal and the synch pulses supplied by the studio synchronizer.

In a first embodiment of the invention, the signal derived from the magnetic tape is passed through a first phase error corrector, in order to correct larger time base errors and thereby perform a so-called "coarse" phase error correction, and is thereafter passed through a second phase error corrector, in order to correct the remaining or residual time base error and thereby perform a so-called "fine" phase error correction. The control voltage for controlling the amount of corrective phase shift introduced by the first or "coarse" phase error corrector is derived from a phase comparison between the horizontal synch pulses derived from the magnetic tape and the horizontal synch pulses derived from the studio synchronizer. The control voltage for controlling the amount of corrective phase shift introduced by the second or "fine" phase error corrector is derived from a phase comparison between the studio color synch signal and the color synch signal derived from the magnetic tape; of course, before this latter phase comparison can be performed, the color synch signal is frequency-translated upwards back to its normal frequency.

In a second embodiment of the invention, the control voltage for controlling the amount of corrective phase shift introduced by the second or "fine" phase error corrector is derived from a phase comparison between, on the one hand, the color synch signal while the latter is still in the downwardly-translated frequency range and, on the other hand, a second signal having the frequency of the downwardly-frequency-translated color synch signal, such second signal being derived from the horizontal synch signal of the studio synchronizer by means of frequency multiplication and being gated and phase-shift-controlled by means of the swinging-burst phase-control signal of a conventional PAL color TV system using a swinging burst.

In a third embodiment of the invention, the circuit of the first embodiment is modified, by introducing an additional phase error corrector in the transmission path between the first or "coarse" phase error corrector and the secone or "fine" phase error corrector, in order to further reduce the phase error of the signal passing through the first phase error corrector before such signal is applied to the "fine" phase error corrector. This embodiment is of particular significance where the time base error in the signal derived from the magnetic tape is very large.

The novel features which are considered as characteristic for the invention are set forth in particular in the appended claims. The invention itself, however, both as to its constuction and its method of operation, together with additional objects and advantages thereof, will be best understood from the following description of specific embodiments when read in connection with the accompanying drawing.

DESCRIPTION OF THE PREFERRED EMBODIMENTS

Figure 1:
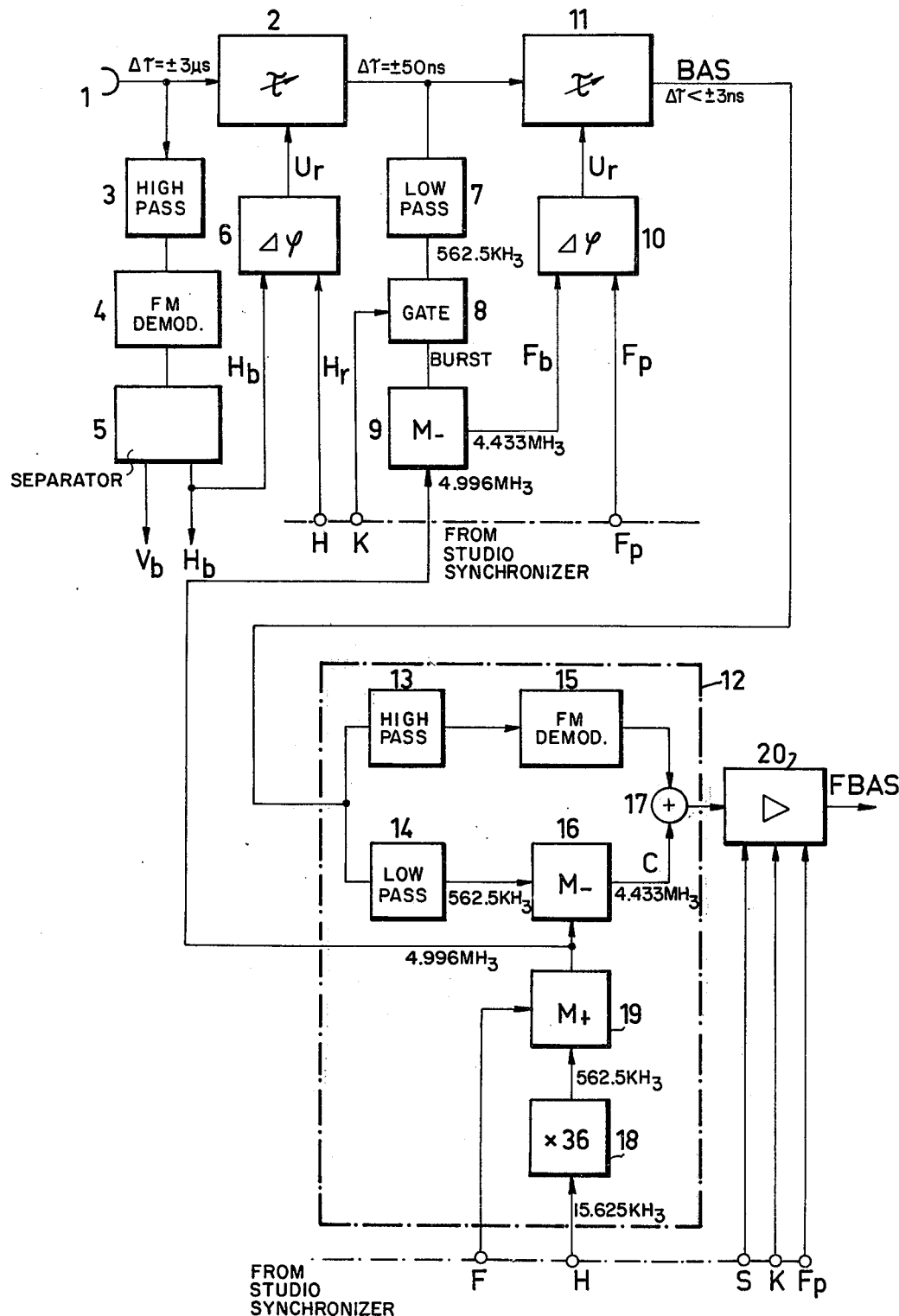
FIG. 1 depicts a first embodiment of the invention.

FIG. 1 depicts a first embodiment of the invention. The signal derived from the non-illustrated magnetic recording tape by means of the magnetic head 1 exhibits a time base error which initially precludes the possibility of reproducing the color TV picture under the control of a studio synchronizer. For this reason, the signal is first applied to a phase-equalizing arrangement 2 which reduces the phase difference (time error base) to a low residual value of for example about ±50 nanoseconds, in a manner described more fully below.

In addition, the signal derived from the magnetic tape is applied to a high-pass filter 3, which suppresses the downwards translated chrominance signal. The resulting signal at the output of high-pass filter 3 is applied to an FM demodulator 4. The demodulated signal is then applied to an amplitude separator 5 which separates out the vertical synch pulses $V_b$ and the horizontal synch pulses $H_b$. The horizontal synch pulses $H_b$ thusly derived from the magnetic tape are applied to one input of a phase comparator 6. Applied to the second input of phase comparator 6 are the studio horizontal synch pulses $H_r$ furnished by the studio synchronizer. The reference voltage $U_r$ appearing at the output of the phase comparator 6 is indicative of the phase shift between the horizontal synch pulses $H_b$ derived from the magnetic tape and the horizontal synch pulses $H_r$ furnished by the studio synchronizer. This phase-shift-indicating reference voltage $U_r$ is applied to the control input of the phase equalizer 2. Depending upon the value of the phase-shift-indicating reference voltage $U_r$, the phase equalizer 2 is set to one of a plurality of different phase-shift settings, the available increments of phase shift being 50 nanoseconds each. In other words, if the reference voltage $U_r$ indicates that the horizontal synch pulses $H_b$ and $H_r$ respectively derived from the magnetic tape and the studio synchronizer are greatly out of phase, then the phase equalizer 2 will be set to a large multiple of 50 nanoseconds, for example 1000 nanoseconds. On the other hand, if the reference voltage $U_r$ indicates a lesser phase shift between the horizontal synch pulses $H_b$ and $H_r$, then the phase equalizer 2 will be set to a smaller multiple of 50 nanoseconds, for example 100 nanoseconds. Since the phase-shift increments available from the phase equalizer 2 are each 50 nanoseconds, it is evident that in the worst possible case, the residual phase shift between the pulses $H_b$ and $H_r$ may amount to ±50 nanoseconds. Because this residual phase shift may be as high as 5 nanoseconds, the first phase equalizer 2 may be referred to as a "coarse" phase equalizer.

The residual phase shift in the signal appearing at the output of "coarse" phase equalizer 2 does not preclude the use of this signal for black and white reproduction, but does preclude the use of this signal for color reproduction. Accordingly, the signal at the output of "coarse" phase equalizer 2 is applied to a low pass filter 7 which suppresses the FM luminance signal while passing the downwardly translated modulated chrominance signal which, as already mentioned, has been downwardly translated into a frequency range lower than the frequency range of the luminance signal.

The signal at the output of low pass filter 7, namely the modulated 562.5 kHz chrominance subcarrier, is applied to the input of a gate circuit 8. The gate circuit 8 is controlled by the burst-gating pulse K which is applied to the control input of the gate circuit 8. Accordingly, there appears at the output of gate circuit 8 only the color synchronizing pulse (burst) component of the signal derived from the magnetic tape.

This color synchronizing burst which should have a frequency of 562.5 KHz is applied to one input of a mixer 9. Applied to the other input of mixer 9 is a sinusoid having a frequency of 4.996 MHz, so that if the color synchronizing burst derived from the magnetic tape is properly timed there will be produced at the mixer output, in per se known manner, a signal $F_b$ having the difference frequency of 4.433 MHz. This mixer output signal $F_b$ fluctuates in dependence upon the time base error of the color synchronizing pulse derived from the magnetic tape and is applied to one input of a phase comparator 10. Applied to the other input of phase comparator 10 is a train of color synchronizing bursts $F_p$ supplied from the studio synchronizer. The output voltage $U_r$ of the phase comparator 10 is applied to the control input of a second phase equalizer 11 and controls the phase shift introduced by phase equalizer 11 in a sense and to an extent so greatly reducing the time base error of the signal applied to the input of phase equalizer 11 that the phase corrected signal at the output of phase equalizer 11 can be employed without difficulty for color reproduction by any reproducing apparatus synchronized with the studio synchronizer. The second phase equalizer 11 may be considered a "fine" phase equalizer, in the sense that it reduces still further the phase discrepancy already partly reduced by the first phase equalizer 2.

The signal appearing at the output of "fine" phase equalizer 11 is applied to a decoder 12. The operation of the decoder 12 is per se conventional and does not per se form part of the present invention. Its construction will be explained only to the extent necessary to understand what does constitute the present invention.

The phase corrected signal at the output of "fine" phase equalizer 11 is separated again into its chrominance and luminance components. To this end, the phase corrected signal is applied to a high pass filter 13 and to a low pass filter 14. The high pass filter 13 serves to suppress the upper and lower sidebands of the downwardly-frequency-translated chrominance signal whose bandwidth, as already mentioned, is located below the bandwidth of the luminance signal; the high pass filter 13 passes signals in the bandwidth of the luminance signal, and accordingly the luminance signal is applied to the input of an FM demodulator 15, so that at the output of demodulator 15 there appears the composite monochrome television signal. The low pass filter 14, on the other hand, passes the color synch signal and the chrominance signal having a middle frequency of 562.5 Hz. The color synch signal and chrominance signal are then applied to one input of a mixer 16. Applied to the other input of mixer 16 is a 4.996 MHz sinusoid. In per se known manner, there appears at the output of mixer 16 the chrominance signal and the color synch signal frequency-translated upwardly back to the conventional frequency of 4.433 MHz. The conventional chrominance signal and color synch signal are then added by an adder 17 to the composite monochrome television signal, to produce a complete composite color television signal.

The 4.996 MHz signal applied to the mixer 16 is derived by multiplying by a factor of 36 the 15.625 kHz studio horizontal frequency, by means of a frequency multiplier 18, thereby obtaining at the output of multiplier 18 a signal having a frequency of 562.5 kHz. This 562.5 kHz signal is applied to one input of a mixer 19. Applied to the other input of mixer 19 are color synch pulses having the conventional frequency of 4.433 MHz. There accordingly appears at the output of mixer 19 the 4.996 MHz signal needed for the frequency translation of the chrominance and color synch signals back up to the conventional frequency of 4.433 MHz.

It may happen that the flanks of the synch and color synch pulses will undergo a certain amount of deterioration in the recovery process, and the provision of the equalizer 2 may detrimentally affect the horizontal blanking pulses. For this reason the composite color television signal appearing at the output of decoder 12 is applied to a regeneration arrangement 20 which regenerates the various synch and color synch pulses.

Figure 2:
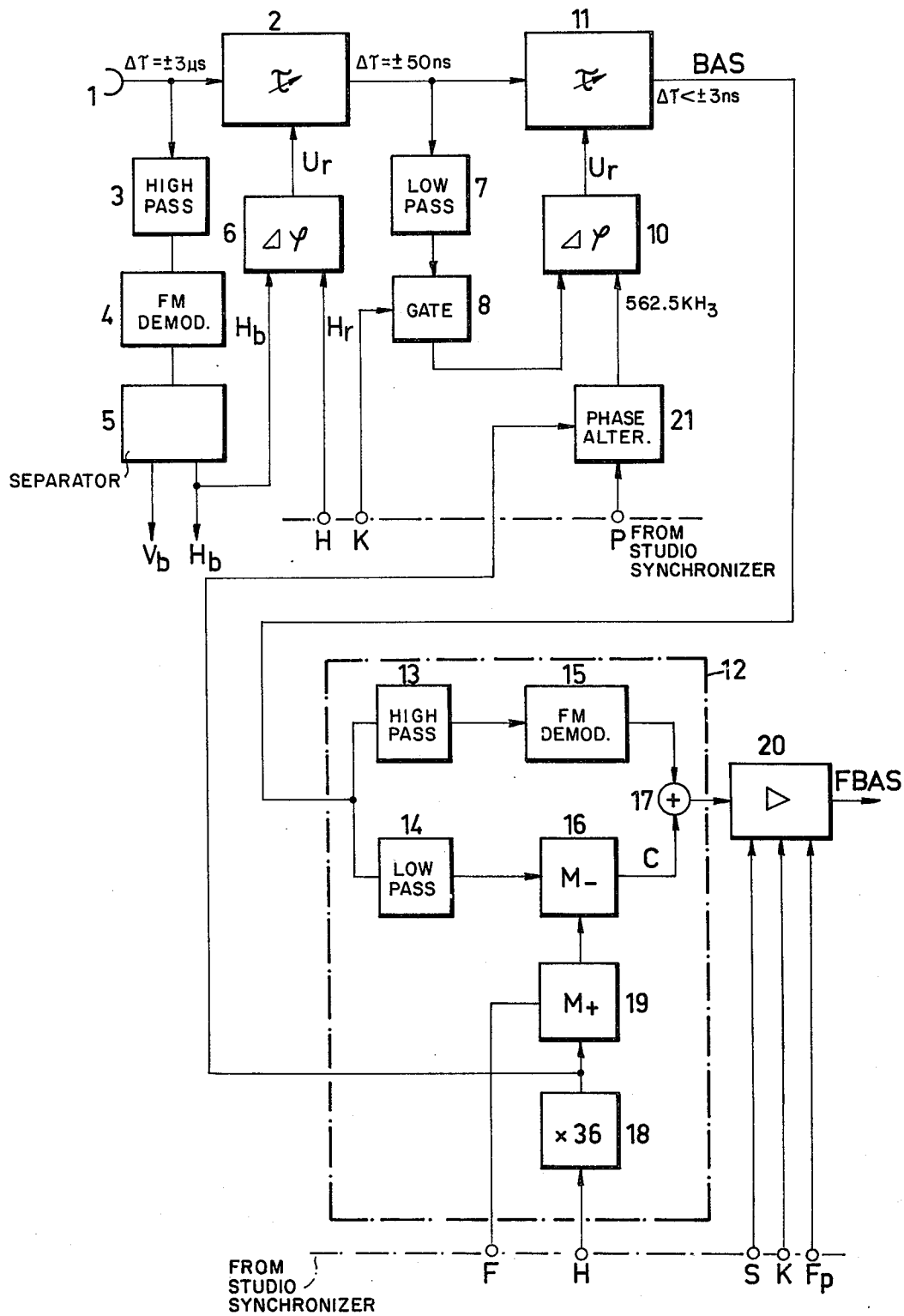
FIG. 2 depicts a second embodiment of the invention.

The embodiment of FIG. 2 is for the most part comprised of the same components as that of FIG. 1, corresponding components being designated by the same reference numerals. However, in the FIG. 1 embodiment, the phase comparison employed for the control of the "fine" phase equalizer 11 involved a 4.433 MHz signal, whereas in the FIG. 2 embodiment this phase comparison involves a 562.5 KHz signal. Accordingly, the mixer 9 used in FIG. 1 is not used in FIG. 2. Instead, the output of the gating circuit 8 is connected directly to one input of the second phase comparator 10. Applied to the second input of phase comparator 10 is the 562.5 KHz signal derived from the frequency multiplier 18, such signal being first applied to a phase alternating stage 21 which introduces into the 562.5 KHz signal applied to stage 21 an alternating phase shift corresponding to the alternating phase shift in the color synch bursts of the chrominance subcarrier contained in the color TV signal derived from the magnetic tape, in dependence upon the P code signal of a conventional PAL color television system, so that the signal applied to the right-hand input of phase comparator 10 will always have the proper phase shift for performing a phase comparison with the bursts appearing at the output of gating circuit 9.

Figure 3:
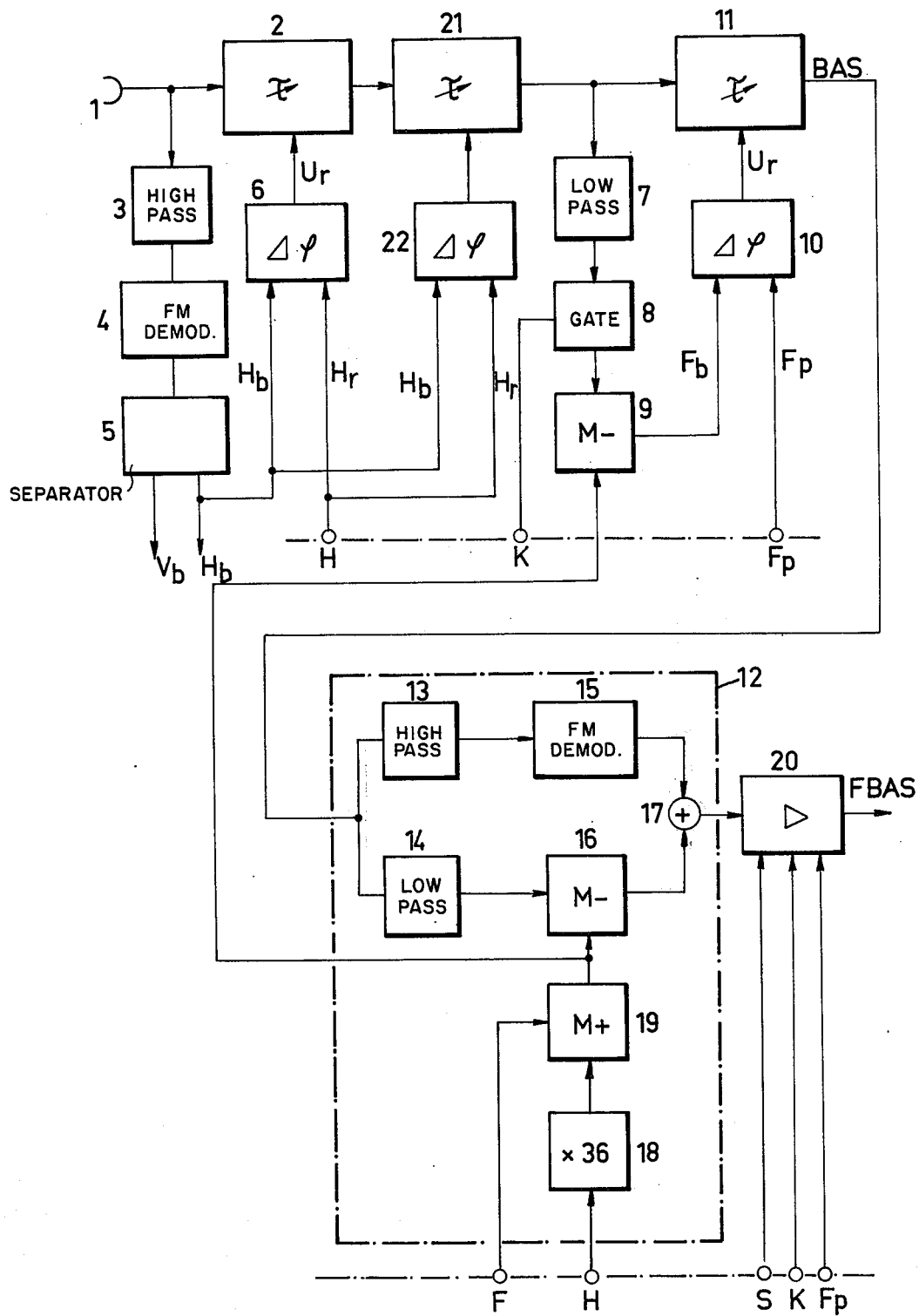
FIG. 3 depicts a third embodiment of the invention.

The circuit arrangement of FIG. 3 is similar to that of FIG. 1, corresponding components in the two circuits being designated by the same reference numerals. The signal derived from the magnetic tape may exhibit very large time base errors, such as cannot be satisfactorily reduced in one stage by the first or "coarse" phase error corrector 2, so that as a result the continuously variable phase error corrector 11 may not be able to process the signal without marked phase jumps. In such event, it is advantageous to insert in the transmission path between the first phase error corrector 2 and the second phase error corrector 11 a third phase error corrector 21. The control voltage which automatically adjusts the amount of corrective phase shift introduced by the phase error corrector 21, as was the case with the corrector 2, is derived from a phase comparison between the horizontal synch signal derived from the magnetic tape and the horizontal synch signal supplied by the studio synchronizer, the actual phase comparison being performed in an additional phase comparator 22. In this way, the first or "coarse" phase error corrector 2 can be designed to provide larger increments of phase shift, in order to be able to correct the larger phase errors in question. The construction and operation of the remainder of the circuit are the same as in FIG. 1.

It will be understood that each of the elements described above, or two or more together, may also find a useful application in other types of circuits and constructions differing from the type described above.

While the invention has been illustrated and described as embodied in a method and apparatus for coupling the signal derived from a magnetic video tape to a studio synchronizer for the purpose of reproducing a color TV picture, it is not intended to be limited to the details shown, since various modifications and structural changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. In a method of reproducing a color TV picture from a color TV signal recorded on an information carrier, when the color TV signal recorded on the information carrier includes a luminance component which occupies a predetermined luminance frequency range and furthermore includes a modulated chrominance subcarrier which instead of a first chrominance frequency range having a first or conventional location relative to the luminance frequency range occupies a different second chrominance frequency range having a different location relative to said luminance frequency range in order to facilitate recording of the modulated chrominance subcarrier, comprising the steps of deriving a color TV signal from the information carrier, producing a synchronizing signal from a studio synchronizer, introducing into the color TV signal derived from the information carrier a corrective phase shift for bringing the color TV signal into synchronism with the signal from the studio synchronizer, said step of introducing the corrective phase shift into the color TV signal derived from the information carrier being performed while said luminance component and said modulated chrominance subcarrier still occupy said predetermined luminance frequency range and said second chrominance frequency range, respectively, and only thereafter effecting a frequency translation of the modulated chrominance subcarrier from said second to said first chrominance frequency range to form a color TV signal comprised of a luminance component occupying said predetermined luminance frequency range and a modulated chrominance subcarrier occupying said first chrominance frequency range.

2. In a method as defined in claim 1, wherein said step of introducing a corrective phase shift comprises introducing a first corrective phase shift into the color TV signal derived from the information carrier and thereafter introducing into the resulting color TV signal a second corrective phase shift sufficient to bring the signal into synchronism with the studio synchronizer.

3. In an arrangement for reproducing a color TV picture from a color TV signal recorded on an information carrier and comprised of a luminance component which occupies a predetermined luminance frequency range with a modulated chrominance subcarrier which instead of a first chrominance frequency range having a conventional location relative to the luminance frequency range occupies a different second chrominance frequency range having a different location relative to said luminance frequency range in order to facilitate recording of the modulated chrominance subcarrier, in combination, a studio synchronizer; phase error correcting means operative for introducing into the color TV signal derived from the information carrier a corrective phase shift bringing the signal into synchronism with said studio synchronizer, said phase error correcting means introducing said corrective phase shift into the color TV signal derived from the information carrier while said luminance component and said modulated chrominance subcarrier still occupy said predetermined luminance frequency range and said second chrominance frequency range, respectively, chrominance subcarrier are superimposed upon; and decoding means connected to receive the color TV signal derived from the information carrier after such signal has been brought into synchronism with said studio synchronizer and operative for converting such color TV signal into a color TV signal comprised of a luminance component occupying said predetermined luminance frequency range and a modulated chrominance subcarrier occupying said first chrominance frequency range by effecting a frequency translation of said modulated chrominance subcarrier from said second to said first chrominance frequency range.

4. In an arrangement as defined in claim 3, wherein said phase error correcting means comprises first phase error correcting means having an input connected to receive the color TV signal derived from the information carrier and operative for introducing into such signal a first corrective phase shift dependent upon the phase discrepancy between the horizontal synch signal contained in the color TV signal derived from the information carrier and a horizontal synch signal generated by said studio synchronizer, and second phase error correcting means having an input connected to the output of said first phase error correcting means and operative for introducing into the output signal of said first phase error correcting means a second corrective phase shift dependent upon the phase discrepancy between the color synch signal contained in the color TV signal appearing at the output of said first correcting means and the color synch signal generated by said studio synchronizer.

5. In an arrangement as defined in claim 4, wherein said second phase error correcting means comprises means for introducing a corrective phase shift which is continuously variable, and means for continuously varying the introduced phase shift in dependence upon the phase discrepancy between said color synch signals.

6. In an arrangement as defined in claim 4, wherein said first phase error correcting means comprises means for introducing any of a finite plurality of discrete phase shifts, and means for automatically selecting one of said finite plurality of discrete phase shifts in dependence upon the phase discrepancy between said horizontal synch signals.

7. In an arrangement as defined in claim 6, wherein said second phase error correcting means comprises means for introducing a corrective phase shift which is continuously variable, and means for continuously varying the introduced phase shift in dependence upon the phase discrepancy between said color synch signals.

8. In an arrangement as defined in claim 3, wherein said phase error correcting means comprises first phase error correcting means having an input connected to receive the color TV signal derived from the information carrier and operative for introducing into such signal a first corrective phase shift dependent upon the phase discrepancy between the horizontal synch signal contained in the color TV signal derived from the information carrier and a horizontal synch signal generated by said studio synchronizer, means for deriving from the signal at the output of said first phase error correcting means a signal having the frequency of the chrominance subcarrier, means for generating a signal having a predetermined fixed frequency, mixing means for combining said signal having the frequency of the chrominance subcarrier and said signal having a predetermined fixed frequency to form an output signal having the frequency of a color synch signal generated by said studio synchronizer, and second phase error correcting means having an input connected to the output of said first phase error correcting means and operative for introducing into the output signal of said first phase error correcting means a second corrective phase shift dependent upon the phase discrepancy between the color synch signal generated by said studio synchronizer and the output signal of said mixing means.

9. In an arrangement as defined in claim 8, wherein said second phase error correcting means comprises means for introducing a corrective phase shift which is continuously variable, and means for continuously varying the introduced phase shift in dependence upon the phase discrepancy between the color synch signal generated by said studio synchronizer and the output signal of said mixing means.

10. In an arrangement as defined in claim 3, wherein said phase error correcting means comprises first phase error correcting means having an input connected to receive the color TV signal derived from the information carrier and operative for introducing into such signal a first corrective phase shift dependent upon the phase discrepancy between the horizontal synch signal contained in the color TV signal derived from the information carrier and a horizontal synch signal generated by said studio synchronizer, means for deriving from the line frequency of the studio synchronizer a fixed frequency signal having the frequency of the chrominance subcarrier contained in the color TV signal appearing at the output of said first phase error correcting means, phase alternating means for introducing into said fixed frequency signal an alternating phase shift corresponding to the alternating phase shifts in the color synch bursts of the chrominance subcarrier contained in the color TV signal appearing at the output of said first phase error correcting means, and second phase error correcting means having an input connected to the output of said first phase error correcting means and operative for introducing into the output signal of said first phase error correcting means a second corrective phase shift dependent upon the phase discrepancy between the color synch bursts in the color TV signal appearing at the output of said first correcting means and the output signal of said phase alternating means.

11. In an arrangement as defined in claim 3, wherein said phase error correcting means comprises first phase error correcting means having an input connected to receive the color TV signal derived from the information carrier and operative for introducing into such signal a first corrective phase shift dependent upon the phase discrepancy between the horizontal synch signal contained in the color TV signal derived from the information carrier and a horizontal synch signal generated by said studio synchronizer, and second phase error correcting means having an input connected to receive the color TV signal appearing at the output of said first phase error correcting means and operative for introducing into such signal a second corrective phase shift dependent upon the phase discrepancy between the horizontal synch signal contained in the color TV signal appearing at the output of said first phase error correcting means and the horizontal synch signal generated by said studio synchronizer, and third phase error correcting means having an input connected to receive the color TV signal appearing at the output of said second phase error correcting means and operative for introducing into such signal a continuously variable third corrective phase shift dependent upon the phase discrepancy between one of the synch signals contained in the color TV signal appearing at the output of said second phase error correcting means and a corresponding signal derived from one of the synch signals generated by said studio synchronizer.

12. In an arrangement as defined in claim 3, wherein said decoding means comprises means for deriving from one of the synch signals generated by said studio synchronizer a signal having the frequency of the chrominance subcarrier contained in the color TV signal recorded on said information carrier.

* * * * *